United States Patent
Itoh et al.

(10) Patent No.: US 8,206,561 B2
(45) Date of Patent: Jun. 26, 2012

(54) CYLINDRICAL SPUTTERING TARGET, CERAMIC SINTERED BODY, AND PROCESS FOR PRODUCING SINTERED BODY

(75) Inventors: Kenichi Itoh, Yokohama (JP); Hitoshi Mashiko, Fujisawa (JP); Tetsuo Shibutami, Sagamihara (JP)

(73) Assignee: Tosoh Corporation, Yamaguchi (JP)

( * ) Notice: Subject to any disclaimer, the term of this patent is extended or adjusted under 35 U.S.C. 154(b) by 730 days.

(21) Appl. No.: 11/072,226

(22) Filed: Mar. 7, 2005

(65) Prior Publication Data

US 2006/0151321 A1   Jul. 13, 2006

(30) Foreign Application Priority Data

Mar. 5, 2004 (JP) .............................. P. 2004-063171

(51) Int. Cl.
  *C23C 14/06* (2006.01)
(52) U.S. Cl. .............................. 204/298.12; 204/298.13
(58) Field of Classification Search ............. 204/298.12, 204/298.13
  See application file for complete search history.

(56) References Cited

U.S. PATENT DOCUMENTS

| | | | |
|---|---|---|---|
| 3,855,110 A * | 12/1974 | Quinn et al. | 204/298.02 |
| 4,545,882 A * | 10/1985 | McKelvey | 204/192.13 |
| 4,838,935 A * | 6/1989 | Dunlop et al. | 75/230 |
| 5,354,446 A | 10/1994 | Kida et al. | |
| 5,435,965 A | 7/1995 | Mashima et al. | |
| 5,593,082 A * | 1/1997 | Ivanov et al. | 228/122.1 |
| 5,879,524 A * | 3/1999 | Hurwitt et al. | 204/298.12 |
| 2002/0012599 A1* | 1/2002 | Hasegawa et al. | 419/19 |
| 2004/0163945 A1* | 8/2004 | Hartig | 204/192.12 |
| 2004/0253382 A1 | 12/2004 | De Bosscher et al. | |

FOREIGN PATENT DOCUMENTS

| | | |
|---|---|---|
| JP | 58-500174 A | 2/1983 |
| JP | 3-60351 A | 3/1991 |
| JP | 3-153867 A | 7/1991 |
| JP | 3-153868 A | 7/1991 |
| JP | 5-39566 A | 2/1993 |
| JP | 5-156431 A | 6/1993 |
| JP | 5-214525 A | 8/1993 |
| JP | 5-230645 A | 9/1993 |
| JP | 5-311428 A | 11/1993 |
| JP | 6-293963 A | 10/1994 |
| JP | 8-60351 A | 3/1996 |
| JP | 10-68072 A | 3/1998 |

(Continued)

OTHER PUBLICATIONS

"Understanding Solids: The Science of Materials." R.J.D. Tilley. ISBN 0470852763, 9780470852767. p. 191. 2004.*
Office Action dated Oct. 4, 2011 from the Korean Intellectual Property Office in counterpart Korean application No. 10-2005-0018306.
Office Action dated Jun. 29, 2011 from the Taiwanese Patent Office in counterpart Taiwanese Application No. 094106749.

(Continued)

*Primary Examiner* — Keith Hendricks
*Assistant Examiner* — Jason M Berman
(74) *Attorney, Agent, or Firm* — Sughrue Mion, PLLC

(57) ABSTRACT

A hollow cylindrical ceramic sintered body having high density, a process for producing the sintered boy, and a cylindrical ceramic sputtering target having high quality without cracks or breakage, are disclosed. The hollow cylindrical ceramic sintered body is obtained by placing a cylindrical ceramic molding to be sintered on a plate-like ceramic molding having a coefficient of sintering shrinkage similar to that of the cylindrical ceramic molding, and then sintering the resulting assembly, thereby obtaining a hollow cylindrical ceramic sintered body having a relative density of 95% or higher. The cylindrical ceramic sputtering target is prepared using the hollow cylindrical ceramic sintered body.

7 Claims, 1 Drawing Sheet

FOREIGN PATENT DOCUMENTS

| | | |
|---|---|---|
| JP | 10280137 A | 10/1998 |
| KR | 19960013892 B1 | 10/1996 |
| TW | 477781 B | 3/2002 |
| WO | 03/016583 A1 | 2/2003 |

OTHER PUBLICATIONS

Office Action dated Jan. 9, 2012 issued by the Taiwanese Patent Office in Taiwanese Patent Application No. 094106749.

* cited by examiner

CYLINDRICAL SPUTTERING TARGET, CERAMIC SINTERED BODY, AND PROCESS FOR PRODUCING SINTERED BODY

FIELD OF THE INVENTION

The present invention relates to a cylindrical sputtering target used in a magnetron rotating cathode sputtering apparatus, a hollow cylindrical ceramic sintered body used as a target material, and a process for producing the ceramic sintered body.

BACKGROUND ART

A magnetron rotating cathode sputtering apparatus a magnetic filed generation device inside a cylindrical target, and performs sputtering by rotating a target while cooling from the inside of the target. The entire face of the target material becomes an erosion state, and is uniformly cut. As a result, markedly high target use efficiency (60% or higher) is obtained, compared with use efficiency (20-30%) of the conventional flat plate type magnetron rotating cathode sputtering apparatus. Further, by rotating a target, large power per unit area can be introduced, compared with the conventional flat plate type magnetron rotating cathode sputtering apparatus. As a result, high film formation rate is obtained (see, for example, JP-T-58-500174) (The term "JP-T" as used herein means a published Japanese translation of a PCT patent application). Such a rotating cathode sputtering method is wide spread in a metal target which is easily processed into a cylindrical shape and has high mechanical strength. However, in a ceramic target having low strength and being brittle, cracks, deformation or the like are liable to occur during its production. For this reason, only a target produced using a specific material or produced by a specific process has been used.

It is known that the conventional flat plate type the conventional flat plate type sputtering target improves its quality by increasing a density of its ceramic sintered body. For example, in ITO (Indium Tin Oxide) used as a transparent conductive film, there are a method of obtaining a high density target by sintering the ITO in a pressurized oxygen atmosphere (for example, JP-A-3-060351), and a method in which density of a sintered body is increased and diameter of sintered particles is controlled, thereby a sputtering rate increases, and generation of nodule on a target surface, causing fine particles, is effectively prevented (for example, JP-A-5-311428). Thus, various ingenuities have been made in the flat plate type ITO target. In particular, in view of that a high density target produced by a sintering method has excellent quality, the sintering method is recently employed as a production method of the flat plate type target.

However, when density of a cylindrical ceramic target is made to have high density using the sintering method, there was the problem that sintering shrinkage is large, so that cracks, deformation and the like occur in sintering. For this reason, the cylindrical target that can be produced by the sintering method has low sintering shrinkage and low density showing a relative density of about 80%, as described in, for example, working examples of JP-A-3-153868 or comparative examples of JP-A-6-156431.

Proposed methods other than the sintering method include a method of forming a target layer on an outer surface of a cylindrical substrate by a plasma spray method (for example, JP-A-10-068072), and a method of forming a target by charging a powder on an outer surface of a cylindrical substrate, and performing hot isotropic pressing (HIP) (for example, JP-A-05-156431). Those methods directly produce a target on the cylindrical substrate. Therefore, the cylindrical substrate and target material (sintered body) cannot be separated from the used target. This gives rise to the problems that reuse of a substrate or recycle of a target material, generally performed, is impossible or difficult, and such is not economical in a sputtering target using an expensive material.

In a method of forming a target layer by an arc spray method, the layer formed tends to contain air bubbles, and have low density. In ITO target described in JP-A-10-068072, the maximum density is 5.3 g/cm$^3$, and this density merely corresponds to a relative density 74% (calculated from true density of ITO: 7.156 g/cm$^3$). This is very low density, compared with a high density target recently used. A method of forming a target by HIP requires large cost, which is not economical. Further, where a sputtering target is produced using ceramics sintered in a reducing atmosphere as in HIP, problems arise that oxides, particularly, ITO, have decreased oxygen content, and quality of a film obtained by sputtering deteriorates.

Where a target is produced by a sintering method, a sintered body must be bonded to a cylindrical substrate. However, this involves the problem that cracks or breakage are liable to occur in such a bonding step. In the cylindrical target, a method of preventing generation of cracks or breakage in a bonding step has been proposed by that instead of using, as a substrate, Cu which has conventionally been used in a flat plate type target, for example, Ti having a coefficient of thermal expansion very similar to that of ITO sintered body being a target material is used as a cylindrical substrate (for example, JP-A-06-293963 and JP-A-08-060351). However, considering that Ti is an expensive material, and Ti can be applied to only the case that the target material and the substrate have the similar coefficient of thermal expansion, use of a cylindrical substrate made of Ti was not yet sufficient in a production process of the cylindrical ceramic target. In this method, heating temperature in bonding is low, and this is effective as a countermeasure for breakage in a bonding step. However, Ag paste is very hard after curing, and does not have ductility as possessed by indium solder. Consequently, the target does not act as a buffering material when the target is heated and expanded in sputtering, and there has been the possibility that the target cracks during sputtering.

SUMMARY OF THE INVENTION

Accordingly, one object of the present invention is to provide a hollow cylindrical ceramic sintered body having high density.

Another object of the present invention is to provide a cylindrical ceramic sputtering target that can be bonded to a cylindrical substrate comprising any material, and in particular, has high quality without cracks or breakage even in bonding to a cylindrical substrate comprising Cu.

Still another object of the present invention is to provide a process for producing the ceramic sintered body.

As a result of various investigations, it has been found that in sintering a hollow cylindrical ceramic sintered body having high density, when a cylindrical ceramic molding to be sintered is placed on a plate-like ceramic molding having a coefficient of sintering shrinkage similar to that of the cylindrical ceramic molding, and the resulting assembly is sintered, cracks or breakage generated during sintering disappear, and a hollow cylindrical ceramic sintered body having a relative density of 95% or higher can be obtained.

It has further been found that in a cylindrical sputtering target comprising a target material comprising a hollow cylindrical ceramic sintered body, and a cylindrical substrate bonded to the target material, there is a correlation between a relative density of the hollow cylindrical ceramic sintered body which is a target material, and cracks or breakage generated in producing the cylindrical sputtering target, and cracks or breakage generated in the production can be prevented by that the relative density of the hollow cylindrical ceramic sintered body is 95% or higher.

The present invention has been completed based on those findings.

The hollow cylindrical ceramic Wintered body according to the present invention is a hollow cylindrical ceramic sintered body for use as a target material in a cylindrical sputtering target, the sintered body having a relative density of 95% or higher.

The process for producing the hollow cylindrical ceramic sintered body according to the present invention is that in sintering a hollow cylindrical ceramic sintered body having high density, a cylindrical ceramic molding is placed on a plate-like ceramic molding having a coefficient of sintering shrinkage similar to that of the cylindrical ceramic molding to be sintered, and the resulting assembly is sintered.

The cylindrical sputtering target according to the present invention comprises a cylindrical substrate, and a target material comprising a hollow cylindrical ceramic sintered body, bonded to an outer surface of the cylindrical substrate, the ceramic target material having a relative density of 95% or higher.

A low melting solder is preferably used to bond the target material comprising the hollow cylindrical ceramic sintered body to the cylindrical substrate. In particular, a low melting solder layer having a thickness of 0.5-1.5 mm is preferably formed between the outer surface of the cylindrical substrate and the hollow cylindrical ceramic sintered body.

The cylindrical substrate that can be used in the cylindrical sputtering target of the present invention is a cylindrical substrate comprising Cu, Cu alloy or SUS.

The material of the ceramic sintered body that can be used is an oxide comprising, as the main component, at least one element selected from the group consisting of In, Sn, Zn, Al, Ta, Nb and Ti.

A low melting solder comprising indium as the main component means a low melting solder containing at least 80% by weight of indium, and the oxide comprising, as the main component, at least one element selected from the group consisting of In, Sn, Zn, Al, Ta, Nb and Ti means an oxide containing 80% by weight or more of the sum of those elements in terms of their oxides.

Figure 1A:
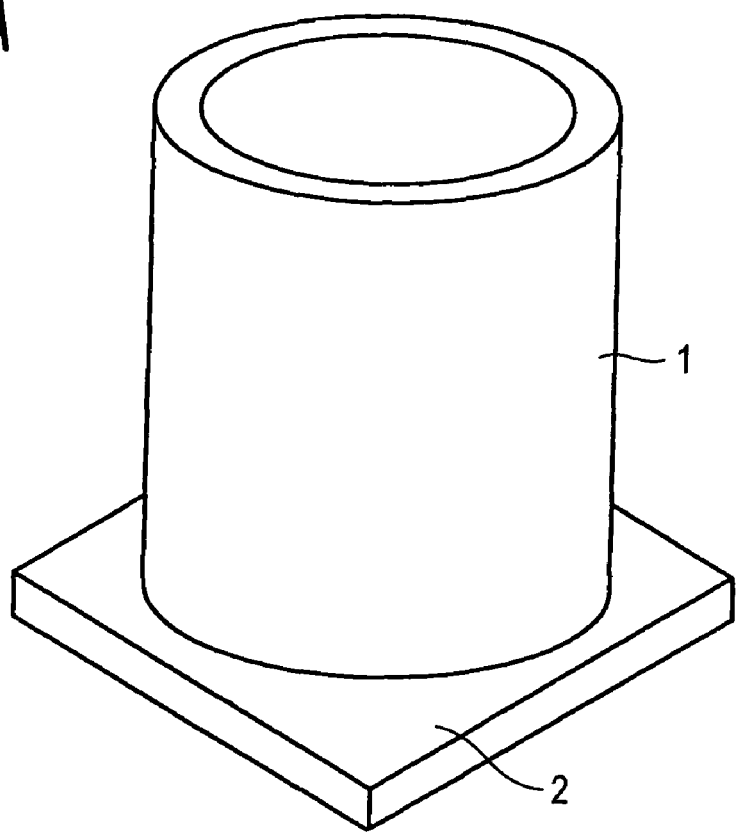
FIG. 1A is a perspective view showing one example of configuration of a molding when dewaxing and sintering in the present invention.

In the Drawings:
1: hollow cylindrical ceramic molding
2: plate-like ceramic molding
3: sintering center of molding

DETAILED DESCRIPTION OF THE INVENTION

The present invention is described in detail below.

The ceramic sintered body of the present invention is not particularly limited. Examples of the sintered body that can be used include ITO (Indium Tin Oxide), AZO (Aluminum Zinc Oxide), IZO (Indium Zinc Oxide), $Ta_2O_5$, $Nb_2O_5$ and $TiO_2$.

The process for producing the hollow cylindrical ceramic sintered body of the present invention is not particularly limited so long as a hollow cylindrical sintered body having a relative density of 95% or higher can be obtained. For example, the sintered body can be produced by the following process.

When at least two kinds of compounds are used as a starting powder, those compounds are mixed to obtain a starting mixed powder. Mixing the starting powder can be conducted by, for example, ball mill, jet mill or cross mixer. Prior to mixing the starting powder, the starting powder is preferably subjected to pulverization and/or classification treatments. Applying the starting powder to such pulverization and/or classification treatments enables the starting powder to have a fine particle diameter, and therefore to mix uniformly. As a result, it is possible to prevent deformation, breakage or density unevenness of the sintered body caused by heterogeneity of composition in the sintered body, making it possible to easily obtain a high density sintered body. Where carbonates or the like other than oxides are used as the starting powder, the powder may be mixed, calcined and then subjected to decarbonation treatment or the like. Where a single kind of a compound is used as the starting powder, it is as a matter of course that the above mixing operation is not necessary. In the present invention, such a powder (single kind) is also called a starting mixed powder.

The starting mixed powder thus obtained is molded by a molding method such as CIP (Cold Isotropic Pressing) method or centrifugal molding method to produce a molding. Where a molding is produced with CIP method, a powder is charged in a cylindrical rubber mold having a core (core rod), and is molded using CIP apparatus under pressure of 500 kg/cm$^2$ or higher. If required and necessary, the CIP can be conducted under further high pressure. Second time or subsequent CIP is conducted after placing the cylindrical molding in a thin rubber bag and then conducting vacuum deaeration. The pressure applied is a pressure higher than that in CIP treatment conducted immediately before, and is preferably 1,000 kg/cm$^2$ or higher, more preferably 2,000 kg/cm$^2$ or higher. Where the powder has poor moldability, a binder comprising, as the main component, an organic compound such as paraffin or polyvinyl alcohol may be added to the powder, if required and necessary. A molding obtained by CIP method has poor shape accuracy. Therefore, such a molding may be subjected to grinding processing with lathe at the stage of a molding.

Where a molding is produced by a centrifugal molding method, a binder, a dispersing agent and water are added to a starting mixed powder, and the resulting mixture is mixed with ball mill or the like to prepare a molding slurry. To obtain further sufficient mixing effect, mixing time is preferably 3 hours or longer, more preferably 5 hours or longer.

Viscosity of the slurry is determined depending on the amounts of the above dispersing agent, binder and water added. To obtain a molding having high strength and to obtain good adhesion properties to a mold, the viscosity is preferably 100-5,000 centipoise, more preferably 500-2,500 centipoise.

The slurry thus obtained is subjected to centrifugal molding. Degassing of the slurry is preferably conducted prior to molding. Degassing is conducted, for example, as follows. Polyalkylene glycol defoaming agent is added to the slurry, and the resulting mixture is subjected to degassing treatment under vacuum.

A mold for use in the centrifugal molding is a cylindrical mold comprising a porous material. Porous resin or gypsum can be used as a material for the mold without any limitation. The centrifugal molding is a molding method comprising placing a slurry in a cylindrical porous mold, and rotating the mold at high speed to absorb water in the slurry in the porous mold, thereby forming a molding. This method is suitable to obtain a cylindrical molding having high shape accuracy. Outer diameter of a cylindrical molding is determined by an inner diameter of the cylindrical porous mold. Thickness of the molding can easily be adjusted to an optional thickness by controlling the amount of slurry introduced. The number of revolution in such a case is preferably 500-3,000 rpm from the standpoint of productivity.

The molding produced by a centrifugal molding method and dried can further be subjected to compaction treatment by CIP, if desired and necessary. To obtain sufficient compaction effect, pressure in such CIP is preferably 1,000 $kg/cm^2$ or higher, more preferably 2,000 $kg/cm^2$ or higher.

To remove water and organic materials such as binder remaining in a molding produced by CIP method or a molding produced by centrifugal molding method, the molding is subjected to dewaxing treatment at a temperature of 300-500° C. Temperature rising rate in such a dewaxing treatment is preferably 10° C./hr or lower, more preferably 5° C./hr or lower, to prevent cracks in the course that a dispersing agent and a binder gasify. Where the molding is produced by CIP method, if an organic material, particularly a binder, is not added, dewaxing treatment may be omitted.

Figure 1B:
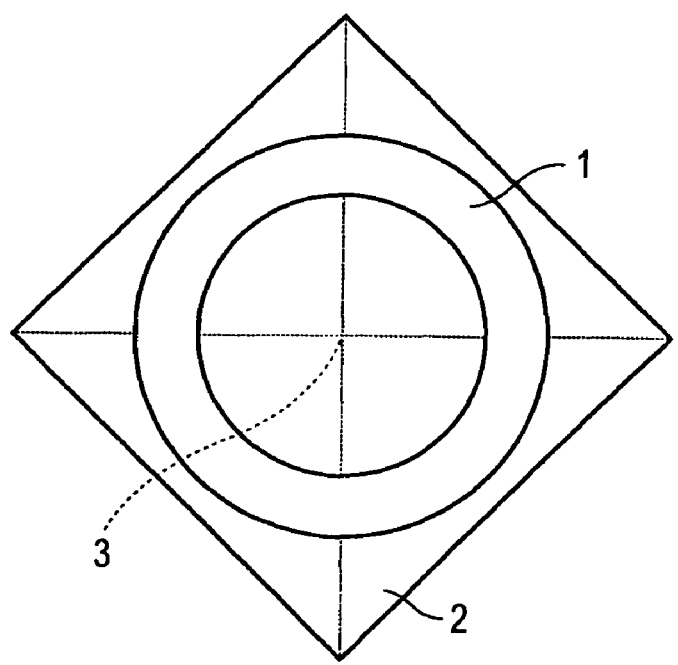
FIG. 1B is a plane view (seen from the upper) of the embodiment shown in FIG. 1A.

The molding thus obtained is sintered in a sintering furnace to produce a ceramic sintered body. The sintering is conducted in a manner such that the molding is placed on a plate-like ceramic molding having a coefficient of sintering shrinkage similar to that of a cylindrical ceramic molding. Specifically, a cylindrical ceramic molding is placed on a plate-like ceramic molding such that a circular cross-section of the cylindrical ceramic molding contacts with a plate face of the plate-like ceramic molding, as shown in FIG. 1A. In particular, the molding is preferably placed such that the center (sintering center) of the cylindrical ceramic molding and the center (sintering center) of the plate-like ceramic molding overlap, as shown in FIG. 1B. Thus, sintering is conducted in a manner such that the cylindrical ceramic molding is placed on the plate-like ceramic molding having a coefficient of shrinkage similar to that of the cylindrical ceramic molding, and this makes it possible to easily prevent breakage or deformation of a sintered body due to sintering shrinkage. Difference between the coefficient of sintering shrinkage of the cylindrical ceramic molding (i.e., coefficient of shrinkage in a radius direction on the circular cross-section) and the coefficient of shrinkage in center direction on a plate face on the plate-like ceramic molding is preferably within ±1%, more preferably ±0.5%. Any material can be used as the material for a ceramic used as a plate-like ceramic molding so long as the coefficient of sintering shrinkage of a molding can be adjusted to the above range by granulation of powder, molding conditions or the like. If the diameter of a cylindrical shape is large, it is preferable that the coefficient of shrinkage is adjusted further strictly. Use of the same material as that used in the cylindrical ceramic molding enables the coefficient of shrinkage to easily adjust. The plate-like ceramic molding is preferably a square flat plate-like ceramic molding as shown in FIG. 1. However, a ceramic molding having a disc shape may be used, and a ceramic molding having polygon shape or a rectangular shape may also be used. Thus, a sintering method using ceramic moldings having similar coefficient of shrinkage does not require any specific sintering tool, and is particularly effective in a material requiring high sintering temperature or a material having high density.

To decrease friction in sintering and shrinking a molding, a powder is spread between the plate-like ceramic molding and a furnace floor (setter), and between the plate-like ceramic molding and the cylindrical ceramic molding. The powder used is not particularly limited so long as it is not reactive with a ceramic material. For example, alumina powder is preferably used in producing ITO sintered body. In order that a molding shrinks uniformly, the powder such as alumina powder has preferably a shape close to a sphere. The powder further preferably has a particle diameter of 100-1,000 µm.

Sintering conditions (sintering temperature, temperature rising rate, temperature lowering rate, etc.) in such a case vary depending on the kind of the ceramic material used. For example, in the case of ITO, the sintering temperature is preferably 1,450-1,650° C. at the temperature of which solid solubilization of tin oxide into indium oxide is promoted. If the sintering temperature is lower than 1,450° C., sintering into ITO is not sufficient, and a sintered body obtained has poor strength. On the other hand, if the sintering temperature exceeds 1,650° C., indium oxide or tin oxide remarkably evaporates from ITO sintered particles, and this is a factor causing problems such as compositional deviation. To obtain a sufficient rising effect of density, the molding is desirably maintained at the sintering temperature for 5 hours or longer, preferably 5-30 hours. The temperature rising rate up to the sintering temperature is preferably 20-100° C./hr, considering uniform shrinkage of the molding due to sintering. The temperature lowering rate up to room temperature after maintaining at the sintering temperature is preferably 100° C./hr or lower from the standpoint of absorbing thermal shock to a sintered body and preventing warpage and cracks.

The above production process makes it possible to obtain a hollow cylindrical ceramic sintered body having a relative density of 95% or higher, preferably 98% or higher, more preferably 99% or higher.

In particular, according to the production process of the hollow cylindrical ceramic sintered body of the present invention, the hollow cylindrical ceramic sintered body having a relative density of 99.7% or higher can be obtained without causing breakage or cracks by optimizing starting mixed powder, molding conditions, sintering conditions and the like, even in the case of an oxide sintered body of indium and tin. Thus, the production process according to the present invention makes it possible to obtain a cylindrical sputtering target having a target material comprising ITO sintered body having a relative density of 99.7% or higher, which has not been obtained in the conventional process. In the conventional flat plate-like ITO sputtering target, it has been required for the target material to have a relative density of 99.7% or higher in order to reduce nodule. Therefore, the cylindrical sputtering target having a target material comprising an oxide sintered body comprising indium and tin, having a relative density of 99.7% or higher can suitably be used as a low nodule ITO sputtering target. The content of indium and tin in the oxide sintered body of indium and tin is preferably 95:5 to 80:20 in terms of weight ratio of indium oxide to tin oxide (indium oxide : tin oxide)

The sintered body obtained by the production process of the hollow cylindrical ceramic sintered body of the present invention involves slight deformation in the sintering step. The sintered body is preferably subjected to grinding processing to obtain a hollow cylindrical sputtering target material. Processing to a cylindrical shape is generally conducted using a lathe. However, a ceramic sintered body is brittle, and hence breakage or strain may occur in fixing the same to a machine tool. Thus, there is the possibility that processing accuracy deteriorates. Therefore, in processing the sintered body, it is preferable that jig is used or processing work is designed such that eccentricity (deviation between center of outer diameter and center of inner diameter) is preferably 0.2 mm or smaller, more preferably 0.1 mm or smaller. This removes ununiform expansion due to heating in bonding the sintered body to a cylindrical substrate, thereby suppressing occurrence of breakage.

The target thus grinding processed is bonded to a cylindrical substrate. In the present invention, material for the cylindrical substrate is not particularly limited, and other than Ti, Mo, SUS or the like having a coefficient of thermal expansion similar to that of ceramics such as ITO can also be used. Further, non-oxygen copper or copper alloys such as phosphorus bronze, conventionally used in a flat plate-like target, can be used. In the present invention, the target material is bonded to a cylindrical substrate using a low melting solder. The low melting solder used is preferably a low melting solder comprising indium as the main component (80 wt % or higher). The indium solder is widely used in a flat plate-like target, and indium is rich in ductility. Therefore, the indium solder has the effect to absorb strain such as thermal expansion between the target material heated during sputtering and the cooled substrate. Further, when the target material is bonded to the substrate with the low melting solder, the target material can easily be peeled from the used target. Thus, reuse of the cylindrical substrate and recycle of the target material are easy.

A method of bonding the target material to the cylindrical substrate is not particularly limited so long as the low melting solder layer having a thickness of 0.5-1.5 mm, preferably 0.5-1.0 mm, can be formed between the outer surface of the cylindrical substrate and the target material comprising the hollow cylindrical ceramic sintered body. The bonding method is conducted, for example, as follows.

The cylindrical target material is processed to have an inner diameter of 1-3 mm, preferably 1-2 mm, smaller than the outer diameter of the cylindrical substrate to which the cylindrical target material is bonded. Portion other than the bonded portion on the target material and the substrate is subjected to a masking treatment using, for example, a heat-resistant film. Indium-based low melting solder is applied by, for example, a thermal spray method to the inner surface of the target material at the same thickness as a clearance (0.5-1.5 mm, preferably 0.5-1.0 mm) to the substrate. The target material is placed in an oven in a state that a ribbon type resistance heater is wound around the target material, and heated therein at a temperature (for example, 150° C. in the case of indium) slightly lower than the melting point of the indium-based low melting solder (for example, 156.6° C. in the case of indium). Similarly, the indium-based low melting solder is applied to the outer surface of the cylindrical substrate, and the substrate is placed in an oven and heated therein at a temperature of 80-120° C. Prior to applying the low melting solder, undercoat treatment such as UV irradiation, Ni plating or deposition may be applied to improve wettablity of the solder.

The ribbon type resistance heater wound around the cylindrical target material is connected to power source to heat the target material. The top portion of the cylindrical substrate is inserted into the hollow portion of the target material, and while elevating the heating temperature with the ribbon type resistance heater, the whole cylindrical substrate is pressurized and inserted into the hollow portion of, the target material. Those operations are preferably conducted in an atmosphere heated to about 80-120° C., but can be conducted at room temperature. When conducted at room temperature, the operation should be conducted smoothly for a short period of time as compared with the case of conducting at a heated atmosphere. Thus, attention should be paid to, for example, set somewhat higher temperature by heater. Pressure applied to insert the cylindrical substrate into the hollow portion of the target material is preferably 0.1 kg/cm$^2$ or lower, more preferably 0.01 kg/cm$^2$, to the unit bonded area when the cylindrical substrate and the target material are finally bonded at the prescribed position. If the pressure is too high, the cylindrical substrate is inserted by such pressure prior to softening the low melting solder. As a result, stress may remain in the bonded portion or bonding ratio between the target material and the substrate may decrease. The "pressure" used herein means pressure including the self weight of the cylindrical substrate. Means for pressurization is not particularly limited. There is, for example, a pressurizing method such as pressurization with a pressurizing machine such as oil pressure press, or a weight. Thus, lowering the heating temperature to the cylindrical substrate has the effect to suppress cracks of the target material due to thermal expansion of the substrate. The substrate comprises a metal. Therefore, there is less possibility that cracks or the like occur in heat shock in the heating operation of the low melting solder. To match the center of the hollow cylindrical target material and the center of the substrate, a plurality of spacers having a thickness smaller than a clearance between the target material and the substrate can be inserted. The spacer can be used without consideration of its direction. Therefore, a wire type spacer is preferably used. In order to achieve both the center-matching accuracy and the operating efficiency, the thickness of spacer is preferably about 80% of the clearance. By the above, the low melting solder layer having a thickness of 0.5-1.5 mm, preferably 0.5-1.0 mm, can be formed between the outer surface of the cylindrical substrate and the target material comprising a hollow cylindrical ceramic sintered body, and the formation of such a layer can effectively absorb strain due to thermal expansion or the like in the bonding step, thereby preventing occurrence of cracks or breakage.

According to the present invention, a high density hollow cylindrical ceramic sintered body having a relative density of 95% or higher can easily be produced. Further, by using such a ceramic sintered body as a target material, occurrence of cracks or breakage in the step of bonding the target material to the cylindrical substrate can effectively be prevented. In addition, by forming a low melting solder layer having a thickness of 0.5-1.5 mm between the outer surface of the cylindrical substrate and the target material comprising a hollow cylindrical ceramic sintered body, and bonding the substrate and the ceramic sintered body, it is possible to effectively absorb strain due to thermal expansion or the like. In combination with use of a high density target material having a relative density of 95% or higher, it is possible to further effectively prevent occurrence of cracks or breakage in the bonding step. In addition to this, even in the use under high electric power density, it is possible to provide an excellent cylindrical sputtering target without occurrence of cracks or breakage. In particular, according to the present invention, it is possible to use a cylindrical substrate comprising various materials such as Cu, Cu alloys or SUS, and it is also possible to provide a cylindrical sputtering target having excellent cooling efficiency at low cost. Further, in the cylindrical sputtering target of the present invention, the low melting solder layer having a uniform thickness of 0.5-1.5 mm is formed between the outer surface of the cylindrical substrate and the target material comprising a hollow cylindrical ceramic sintered body. As a result, the target material can easily be peeled from the used target. This enables the cylindrical substrate to reutilize easily and also the target material to recycle easily.

The present invention will be described in more detail by reference to the following Examples, but it should be understood that the invention is not construed as being limited thereto.

EXAMPLE 1

Indium oxide having a 50% diameter (a particle diameter at 50% volume percent in the cumulative curve of the particle size distribution; hereinafter the same) of 0.54 μm and tin oxide having the diameter of 1.03 μm were mixed with a dry ball mill for 16 hours such that the compositional proportion is indium oxide: tin oxide=1:1 to prepare ITO mixed powder. The ITO mixed powder was taken out of a vessel, and 1.1% of a polycarboxylic acid type dispersing agent (solid content of the agent to the amount of the ITO mixed powder is 1.1%), 1.0% of a polyacrylic acid type binder (solid content of the binder to the amount of the ITO mixed powder is 1.0%), and 25.5% of ion-exchanged water (to the amount of the ITO mixed powder) were added to the powder. The resulting mixture was mixed with a ball mill for 16 hours to obtain a molding slurry. Viscosity of this slurry was measured, and it was found to be 680 centipoise.

A polyalkylene glycol type defoaming agent was added to the slurry, and degassing treatment was conducted in vacuo. The slurry was poured into a cylindrical porous mold for centrifugal molding, made of a resin and having an inner diameter of 125 mm and a length of 200 mm, and centrifugal molding was conducted with the number of revolution of 1,200 rpm. The resulting molding was dried, and then the dispersing agent and binder remained in the molding were removed. For the purpose of sintering, the molding was placed on a flat plate-like ITO molding having a size of 130×130×10 mm so as to match each center. The resulting assembly was subjected to dewaxing and sintering in a sintering furnace having oxygen flow atmosphere under the following conditions.

Dewaxing Conditions
  Dewaxing temperature: 450° C.
  Temperature rising rate: 5° C./hr
  Holding time: None
Sintering Conditions
  Charge weight/oxygen flow rate: 1.00 kg min/liter
  Temperature rising rate: 50° C./hr
  Sintering temperature: 1,450° C.
  Sintering time: 5 hrs
  Temperature lowering rate: 100° C./hr Density of 10 sintered bodies obtained was measured, and it was found to be 6.85-6.89 g/cm$^3$ (relative density: 95.7-96.3%). The density was measured with Archimedean method according to JIS R1634 (1998). Weighted average value, 7.156 g/cm$^3$, calculated from mixing ratio of indium oxide and tin oxide was used as true density of ITO sintered body.

The sintered body obtained was grinding processed to a size having an outer diameter of 98 mm, an inner diameter of 78 mm and a length of 150 mm to prepare a target material. In this processing, the inside (inner diameter) of the sintered body was first processed using a lathe, a tapered fixing jig (having a hole for matching center position) was put in the processed inside of the sintered body, both edges of the fixing jig were fixed with a lathe, and the outside (outer diameter) of the sintered body was processed. In this case, eccentricity (deviation in centers between the inner diameter and the outer diameter) of the cylindrical target material was 0.2 mm or smaller in all 10 samples.

The portion of the cylindrical target material other than the portion to be bonded to a cylindrical substrate was masked with a heat-resistant tape. Six Cu wires each having a diameter of 0.8 mm were arranged to the inner surface of the target material in a length direction, and indium was then thermal sprayed to the inner surface of the target material at a thickness of about 1 mm so as to cover the wires. The target material was placed and heated in a 150° C. oven in a state that a ribbon type resistance heater was wound around the target material.

A cylindrical substrate was used, which is made of Cu, and has an outer diameter of 76 mm, an inner diameter of 66 mm and a length of 150 mm. The portion of the substrate other than the portion to be bonded to the sintered body was masked with a heat-resistant tape, and the substrate was coated with indium using an ultrasonic soldering bit, placed in a 100° C. oven, and heated therein.

The target material was taken out of the 150° C. oven, and then placed in a 100° C. oven. The ribbon type resistance heater was connected to a slide regulator (slidax) to heat the target material. The cylindrical substrate was inserted into the target material from the upper thereof, and was supported with a jig. Heating temperature was elevated with a ribbon type resistance heater. When one/fourth of the cylindrical substrate was inserted in the target material by the self weight of the substrate, 1.5 kg load was placed on the substrate to completely insert the cylindrical substrate into the target material. The assembly was gradually cooled, and the heat-resistant tape was peeled to confirm the target material. As a result, breakage was observed in three target materials often target materials.

EXAMPLE 2

Indium oxide powder and tin oxide powder each were pulverized with a dry ball mill for 48 hours. The tin oxide powder was further subjected to dry jet mill pulverization. 50% diameters of indium oxide powder and tin oxide powder at this stage were 0.46 μm and 0.28 μm, respectively. Those powders were dry mixed in the same manner as in Example 1, and a slurry was prepared using the resulting mixture in the same manner as in Example 1. As a result of measurement of viscosity of this slurry, it was found to be 870 centipoise.

Centrifugal molding was conducted and the resulting molding was dried, in the same manner as in Example 1. CIP treatment was applied to the molding under pressure of 3 ton/cm$^2$. Dewaxing and sintering were conducted in the same manner as in Example 1 except for changing the sintering conditions as follows, thereby preparing ten sintered bodies.
Sintering Conditions
  Charge weight/oxygen flow rate: 0.38 kg·min/liter
  Temperature rising rate: 50° C./hr
  Sintering temperature: 1,600° C.
  Sintering time: 5 hrs
  Temperature lowering rate: 100° C./hr As a result of measurement of density of thus obtained ten sintered bodies in the same manner as in Example 1, it was found to be all 7.14 g/cm$^3$ (relative density: 99.8%).

The sintered bodies were grinding processed in the same manner as in Example 1. The eccentricity was all 0.1 mm or smaller. Each sintered body was bonded to a cylindrical substrate made of Cu in the same manner as in Example 1. No breakage was observed in all ten sintered bodies.

EXAMPLE 3

ITO mixed powder was prepared in the same manner as in Example 1. Paraffin as a binder was added to the powder in an amount of 1.5% (based on the amount of ITO mixed powder).

A cylindrical urethane rubber mold having an inner diameter of 140 mm (wall thickness: 7 mm) and a length of 220 mm, having closing lids at the upper and the lower thereof, and containing a columnar core (shaft) was filled with the powder obtained above while tapping. The rubber mold was closed, and CIP treatment was conducted under a pressure of 3 ton/cm$^2$ to obtain a molding. This molding was processed with a lathe to an outer diameter of 121 mm, an inner diameter of 93 mm and a length of 200 mm. Dewaxing and sintering were conducted in the same manner as in Example 1 except for changing the sintering conditions as follows, thereby preparing ten sintered bodies.
Sintering Conditions
    Charge weight/oxygen flow rate: 1.00 kg min/liter
    Temperature rising rate: 50° C./hr
    Sintering temperature: 1,500° C.
    Sintering time: 5 hrs
    Temperature lowering rate: 100° C./hr As a result of measurement of density of the thus obtained ten sintered bodies in the same manner as in Example 1, it was found to be 7.03-7.05 g/cm$^3$ (relative density: 98.2-98.5%).

The sintered bodies obtained were grinding processed in the same manner as in Example 1 to an outer diameter of 97 mm, an inner diameter of 78 mm and a length of 150. The eccentricity was all 0.1 mm or smaller. Each sintered body was bonded to a cylindrical substrate made of Cu in the same manner as in Example 1. No breakage was observed in all ten sintered bodies.

EXAMPLE 4

Ten sintered bodies were prepared in the same manner as in Example 3.

The sintered bodies obtained were grinding processed in the same manner as in Example 1 to an outer diameter of 97 mm, an inner diameter of 78 and a length of 150 mm to obtain target materials. In this case, the outer diameter was first processed using a lathe. Thereafter, the outer diameter was fixed with the lathe, and the inner diameter was processed. The eccentricity was 0.8-0.3 mm. Each sintered body was bonded to a cylindrical substrate made of Cu in the same manner as in Example 1. Breakage was observed in two sintered bodies of ten sintered bodies.

EXAMPLE 5

Zinc oxide having a 50% diameter of 0.78 μm and aluminum oxide having a 50% diameter of 0.45 μm were mixed with a dry ball mill for 16 hours in a proportion of zinc oxide : aluminum oxide=98:2 (wt %) to prepare AZO mixed powder. Paraffin as a binder was added to the mixed powder in an amount of 1.5% (to the amount of AZO mixed powder).

A molding was prepared and processed in the same manner as in Example 3. To remove a dispersing agent and a binder remained in the molding and sintering the molding, the molding was placed on a plate-like AZO molding having a size of 130×130×10 mm so as to coincide the center of the molding and the center of AZO molding, and was subjected to dewaxing and sintering in an atmospheric sintering furnace under the following conditions. Thus, ten sintered bodies were prepared.
Dewaxing Conditions
    Dewaxing temperature: 450° C.
    Temperature rising rate: 5° C./hr
    Holding time: None
Sintering Conditions
    Temperature rising rate: 50° C./hr
    Sintering temperature: 1,350° C.
    Sintering time: 5 hrs
    Temperature lowering rate: 100° C./hr As a result of measuring density of each of the thus obtained ten sintered bodies in the same manner as in Example 1, it was found to be 5.46-5.48 g/cm$^3$ (relative density: 98.2-98.6%). Weighted average value 5.560 g/cm$^3$ calculated from mixing ratio of zinc oxide and aluminum oxide was used as a true density of the AZO sintered body.

The sintered body obtained was grinding processed into a size having an outer diameter of 98 mm, an inner diameter of 78 mm and a length of 150 mm in the same manner as in Example 1 to prepare a target material. The eccentricity between the inner diameter and the outer diameter of the cylindrical target material was all 0.1 mm or smaller. Each sintered body was bonded to a cylindrical substrate made of Cu in the same manner as in Example 1. No breakage was observed in all ten sintered bodies.

EXAMPLE 6

Indium oxide having a 50% diameter of 0.54 μm and zinc oxide having a 50% diameter of 0.78 μm were mixed with a dry ball mill for 16 hours in a proportion of indium oxide : zinc oxide=90:10 (wt %) to prepare IZO mixed powder as a binder. Paraffin was added to the mixed powder in an amount of 1.5% (to the amount of IZO mixed powder).

A molding was prepared and processed in the same manner as in Example 3. To remove a dispersing agent and a binder remained in the molding and sintering the molding, the molding was placed on a plate-like IZO molding having a size of 130×130×10 mm so as to coincide the center of the molding and the center of IZO molding, and was subjected to dewaxing and sintering in an atmospheric sintering furnace under the following conditions. Thus, ten sintered bodies were prepared.
Dewaxing Conditions
    Dewaxing temperature: 450° C.
    Temperature rising rate: 5° C./hr
    Holding time: None
Sintering Conditions
    Temperature rising rate: 50° C./hr
    Sintering temperature: 1,300° C.
    Sintering time: 5 hrs
    Temperature lowering rate: 100° C./hr As a result of measuring density of each of the thus obtained ten sintered bodies in the same manner as in Example 1, it was found to be 6.91-6.93 g/cm$^3$ (relative density: 99.0-99.2%). Weighted average value 6.983 g/cm$^3$ calculated from mixing ratio of indium oxide and zinc oxide was used as a true density of the IZO sintered body.

The sintered body obtained was grinding processed into a size having an outer diameter of 98 mm, an inner diameter of 78 mm and a length of 150 mm in the same manner as in Example 1 to prepare a target material. The eccentricity between the inner diameter and the outer diameter of the cylindrical target material was all 0.1 mm or smaller. Each sintered body was bonded to a cylindrical substrate made of Cu in the same manner as in Example 1. No breakage was observed in all ten sintered bodies.

COMPARATIVE EXAMPLE 1

Ten ITO sintered bodies were prepared in the same manner as in Example 1, except that the cylindrical molding was directly placed on a sintering furnace, and a flat plate-like ITO molding was not used. In all ten sintered bodies, breakage occurred in the state of expanding to the lower side.

COMPARATIVE EXAMPLE 2

Ten ITO sintered bodies were prepared in the same manner as in Example 1, except that the sintering conditions were changed as follows.
Sintering Conditions
 Charge weight/oxygen flow rate: 1.00 kg·min/liter
 Temperature rising rate: 50° C./hr
 Sintering temperature: 1,400° C.
 Sintering time: 5 hrs
 Temperature lowering rate: 100° C./hr As a result of measuring density of each of the thus obtained ten sintered bodies in the same manner as in Example 1, it was found to be 6.54-6.62 g/cm$^3$ (relative density: 91.4-92.5%).

The sintered body obtained was grinding processed in the same manner as in Example 1. The eccentricity between the inner diameter and the outer diameter of the cylindrical target material was all 0.2 mm or smaller. Each sintered body was bonded to a cylindrical substrate made of Cu in the same manner as in Example 1. Breakage occurred in all ten sintered bodies.

COMPARATIVE EXAMPLE 3

Ten ATO sintered bodies were prepared in the same manner as in Example 4, except that the sintering conditions were changed as follows.
Sintering Conditions
 Temperature rising rate: 50° C./hr
 Sintering temperature: 1,200° C.
 Sintering time: 5 hrs
 Temperature lowering rate: 100° C./hr As a result of measuring density of each of the thus obtained ten sintered bodies in the same manner as in Example 1, it was found to be 5.19-5.23 g/cm$^3$ (relative density: 93.3-94.1%).

The sintered body obtained was grinding processed in the same manner as in Example 1. The eccentricity between the inner diameter and the outer diameter of the cylindrical target material was all 0.1 mm or smaller. Each sintered body was bonded to a cylindrical substrate made of Cu in the same manner as in Example 1. Breakage occurred in all ten sintered bodies.

It should further be apparent to those skilled in the art that various changes in form and detail of the invention as shown and described above may be made. It is intended that such changes be included within the spirit and scope of the claims appended hereto.

This application is based on Japanese Patent Application No. 2004-063171 filed Mar. 5, 2004, the disclosure of which is incorporated herein by reference in its entirety.

What is claimed is:

1. A cylindrical sputtering target comprising a cylindrical substrate, and a target material comprising a hollow cylindrical ceramic sintered body, bonded to an outer surface of the cylindrical substrate, the ceramic target material having a relative density of 98% or higher, and an eccentricity of 0.1 mm or less as a deviation between the center of its outside diameter and the center of its inside diameter, wherein the target material is bonded to the cylindrical substrate using a single layer of a low melting point solder wherein the low melting solder comprises at least 80% by weight of indium.

2. The cylindrical sputtering target as claimed in claim 1, wherein the low melting point solder is in the form of a single layer of a low melting point solder having a thickness of 0.5-1.5 mm, formed between the cylindrical substrate and the target material.

3. The cylindrical sputtering target as claimed in claim 1, wherein the cylindrical substrate comprises Cu, Cu alloy or SUS.

4. The cylindrical sputtering target as claimed in claim 1, wherein the ceramic sintered body is an oxide comprising, as the main component, at least one element selected from the group consisting of In, Sn, Zn, Al, Ta, Nb and Ti.

5. The cylindrical sputtering target as claimed in claim 1, having a relative density of 99.7% or higher.

6. A process for producing a hollow cylindrical ceramic sintered body as claimed in claim 1, which comprises sintering a hollow cylindrical ceramic body, wherein a cylindrical ceramic molding to be sintered is placed on a plate-like ceramic molding having a coefficient of sintering shrinkage similar to that of the cylindrical ceramic molding, and the resulting assembly is sintered.

7. The cylindrical sputtering target as claimed in claim 1, wherein the ceramic sintered body comprises indium tin oxide, aluminum zinc oxide, indium zinc oxide, $Ta_2O_5$, $Nb_2O_5$ or $TiO_2$.

* * * * *